(12) United States Patent
Hashimoto et al.

(10) Patent No.: US 9,793,202 B1
(45) Date of Patent: Oct. 17, 2017

(54) WIRELESS APPARATUS

(71) Applicant: Kabushiki Kaisha Toshiba, Tokyo (JP)

(72) Inventors: Koh Hashimoto, Kanagawa (JP);
Makoto Sano, Kanagawa (JP); Keiju Yamada, Kanagawa (JP); Makoto Higaki, Tokyo (JP); Akihiko Happoya, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/438,895

(22) Filed: Feb. 22, 2017

(30) Foreign Application Priority Data

Aug. 5, 2016 (JP) .................................. 2016-154612

(51) Int. Cl.
| | |
|---|---|
| *H01L 23/552* | (2006.01) |
| *H01L 23/498* | (2006.01) |
| *H01L 23/31* | (2006.01) |
| *H01L 23/66* | (2006.01) |

(52) U.S. Cl.
CPC .... *H01L 23/49838* (2013.01); *H01L 23/3114* (2013.01); *H01L 23/49811* (2013.01); *H01L 23/66* (2013.01); *H01L 2223/6611* (2013.01); *H01L 2223/6677* (2013.01)

(58) Field of Classification Search
CPC ....... H01L 2924/181; H01L 2924/3025; H01L 24/48; H01L 24/83
USPC ................................. 257/659, 678, 687, 704
See application file for complete search history.

(56) References Cited

U.S. PATENT DOCUMENTS

| | | | | |
|---|---|---|---|---|
| 2008/0308641 | A1* | 12/2008 | Finn | G06K 19/0723 235/492 |
| 2010/0270661 | A1* | 10/2010 | Pagaila | H01L 23/29 257/659 |
| 2012/0235870 | A1* | 9/2012 | Forster | H01Q 7/00 343/728 |
| 2013/0078915 | A1* | 3/2013 | Zhao | H01L 23/552 455/41.1 |

(Continued)

FOREIGN PATENT DOCUMENTS

| | | |
|---|---|---|
| JP | 2013-179449 | 9/2013 |
| JP | 2014-217014 | 11/2014 |
| JP | 5710558 | 4/2015 |

*Primary Examiner* — S. V. Clark
(74) *Attorney, Agent, or Firm* — Finnegan, Henderson, Farabow, Garrett & Dunner, L.L.P.

(57) ABSTRACT

According to an embodiment, a wireless apparatus includes an interposer substrate, a semiconductor chip, a nonconductive layer, and a conductive film. The interposer substrate includes a conductive portion. The semiconductor chip is mounted on a component mounting face of the interposer substrate. The nonconductive layer is provided on the component mounting face to seal the chip. The conductive film is configured to cover a surface of the nonconductive layer and a side of the interposer substrate and is electrically connected to the conductive portion. The film has a first slot aperture. The conductive portion has a second slot aperture connecting to the first slot aperture. The first and second slot apertures serve as an integrated slot antenna. The antenna has first and second portions. The first portion includes a boundary between the first and second slot apertures and has a width larger than a width of the second portion.

5 Claims, 9 Drawing Sheets (56) References Cited

U.S. PATENT DOCUMENTS

| | | |
|---|---|---|
| 2013/0222196 A1 | 8/2013 | Hashimoto et al. |
| 2014/0055939 A1 | 2/2014 | Hashimoto et al. |
| 2014/0325150 A1* | 10/2014 | Hashimoto ........... H01L 23/552 |
| | | 711/115 |

* cited by examiner

WIRELESS APPARATUS

CROSS-REFERENCE TO RELATED APPLICATIONS

This application is based upon and claims the benefit of priority from Japanese Patent Application No. 2016-154612, filed on Aug. 5, 2016; the entire contents of which are incorporated herein by reference.

FIELD

Embodiments described herein relate generally to a wireless apparatus.

BACKGROUND

There has been known a conventional method of covering, with a conductive film, the surface of a sealing resin for sealing a semiconductor chip in order to impart a shielding function to a semiconductor package including the semiconductor chip mounted on an interposer substrate. There has also been developed a technique of implementing a module including an antenna by forcing apertures that extend to a conductive portion of an interposer substrate from a main face portion (a face facing a component mounting face of the interposer substrate) to a side face portion (a face facing a side face of the interposer substrate) of a conductive film for shielding, and by using the apertures serving as a slot antenna.

In a case of forming apertures from a conductive film to a conductive portion of an interposer substrate to provide a slot antenna, the aperture in the conductive film and the aperture in the conductive portion of the interposer substrate are formed in separate processes. The aperture in the conductive portion of the interposer substrate is generally formed at the same time as when a pattern such as a wiring pattern is formed on the conductive portion. On the interposer substrate to which a wiring pattern or an aperture has been formed, a component such as a semiconductor chip is mounted, which is then sealed with a sealing resin and covered with a conductive film. The conductive film is then cut with, for example, a laser processing apparatus or an end milling apparatus to form an aperture in the conductive film.

The width of the apertures composing a slot antenna is very small such as approximately 0.1 mm. Thus, it is difficult to form the aperture in the conductive film by correctly aligning the aperture in the conductive film with the aperture in the conductive portion of the interposer substrate that has been formed in advance. If the apertures are discontinuous from each other due to misalignment in the forming, antenna characteristics of the slot antenna deteriorate. In order to provide robustness against such misalignment, the widths of the apertures may be increased. In this case, however, the aperture area on the conductive film increases, and thus shielding performance of the conductive film is degraded.

DETAILED DESCRIPTION

According to an embodiment, a wireless apparatus includes an interposer substrate, a semiconductor chip, a nonconductive layer, and a conductive film. The interposer substrate includes a conductive portion. The semiconductor chip is mounted on a component mounting face of the interposer substrate. The nonconductive layer is provided on the component mounting face to seal the semiconductor chip. The conductive film is configured to cover a surface of the nonconductive layer and a side face of the interposer substrate and is electrically connected to the conductive portion. The conductive film has a first slot aperture. The conductive portion has a second slot aperture connecting to the first slot aperture. The first slot aperture and the second slot aperture serve as an integrated slot antenna. The slot antenna has a first portion and a second portion. The first portion includes a boundary between the first slot aperture and the second slot aperture, and has a width larger than a width of the second portion.

The following describes wireless apparatuses according to embodiments in detail with reference to the accompanying drawings. In the following description, like reference numbers denote components having like functions, and duplicate descriptions will be avoided as appropriate.

First Embodiment

Figure 1:
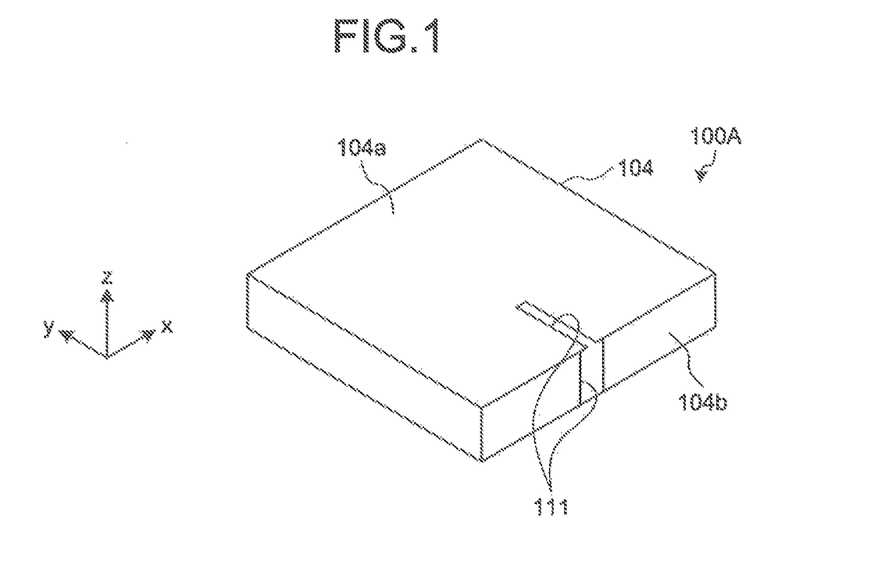
FIG. 1 is a perspective view illustrating a wireless apparatus according to a first embodiment.
Figure 2:
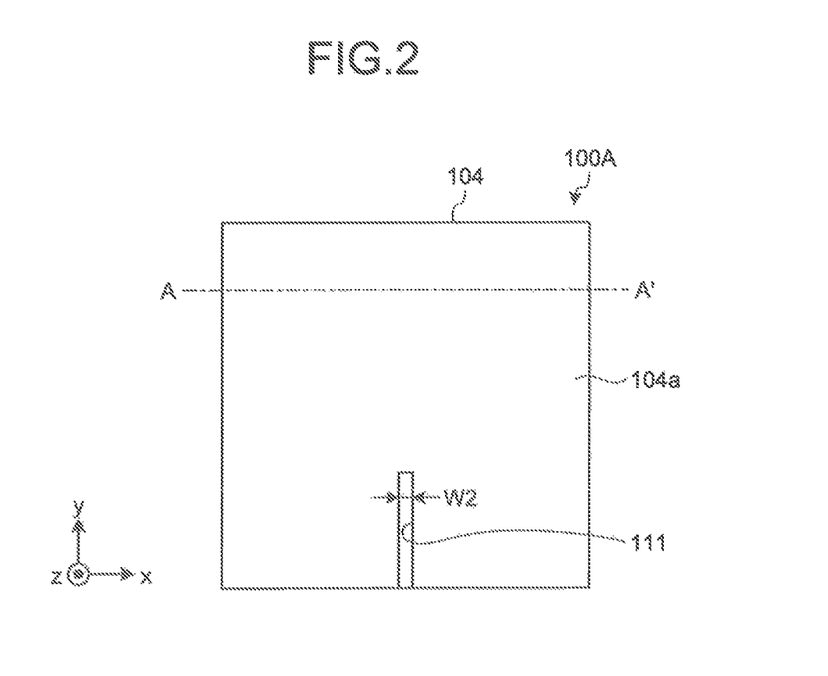
FIG. 2 is a plan view illustrating the wireless apparatus according to the first embodiment.
Figure 3:
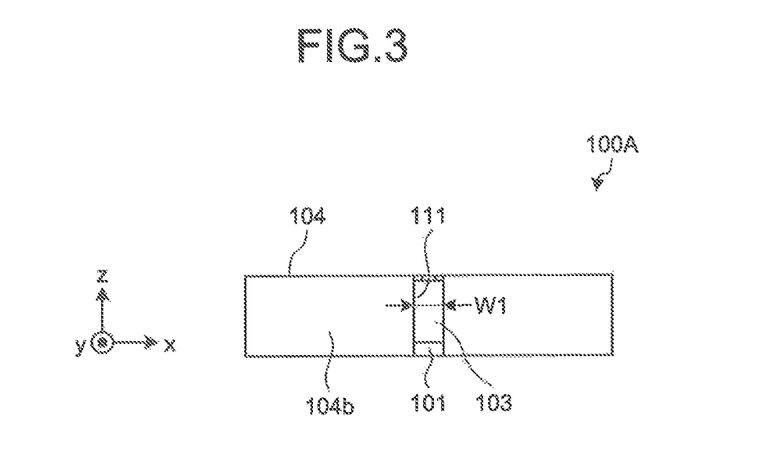
FIG. 3 is a side view illustrating the wireless apparatus according to the first embodiment.
Figure 4:
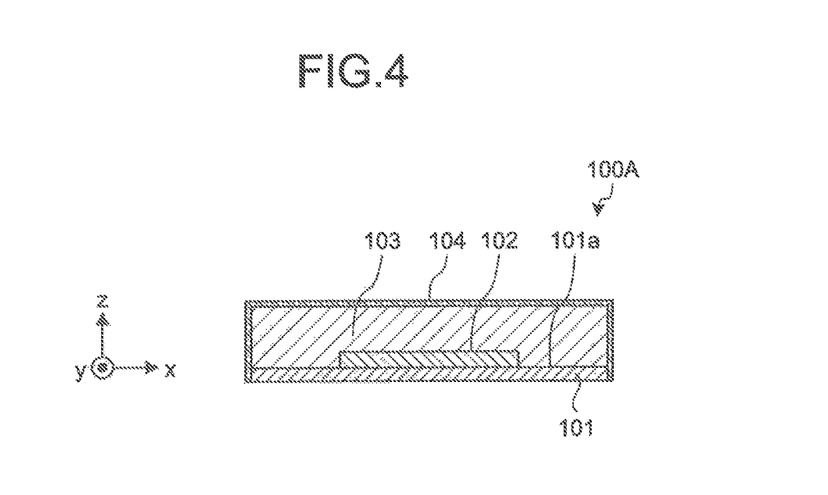
FIG. 4 is a sectional view illustrating the wireless apparatus according to the first embodiment.
Figure 5:
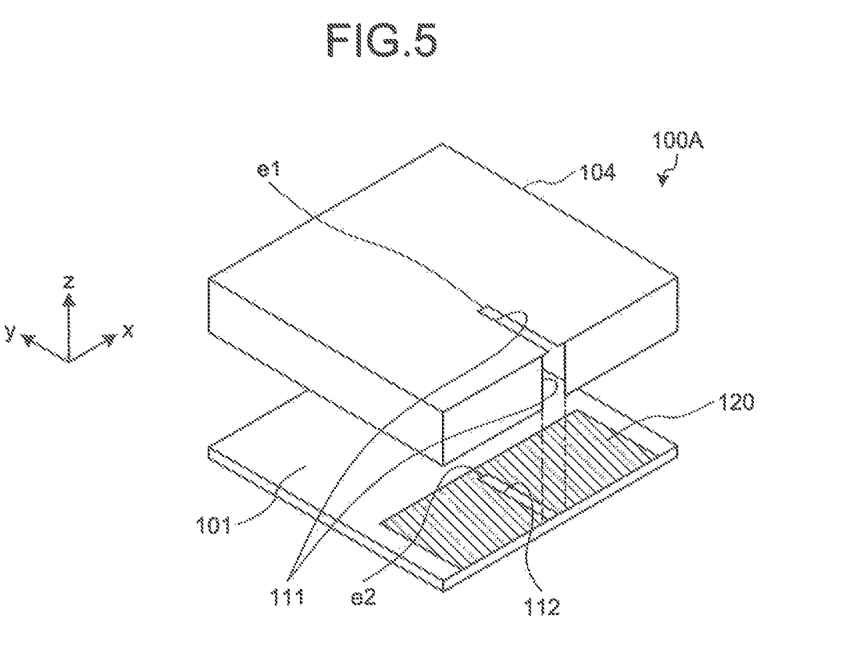
FIG. 5 is a diagram illustrating a second slot aperture.

The following describes a wireless apparatus 100A according to a first embodiment with reference to FIG. 1 to FIG. 5. FIG. 1 is a perspective view illustrating the wireless apparatus 100A according to the first embodiment. FIG. 2 is a plan view illustrating the wireless apparatus 100A according to the first embodiment viewed in the z-axis direction in the diagram. FIG. 3 is a side view illustrating the wireless apparatus 100A according to the first embodiment viewed in the y-axis direction in the diagram. FIG. 4 is a sectional view taken along the line A-A' in FIG. 2 and viewed in the y-axis direction in the diagram. FIG. 5 is a diagram illustrating a second slot aperture provided in a conductive portion of an interposer substrate.

The wireless apparatus 100A of the first embodiment includes an interposer substrate 101 on which a semiconductor chip 102 is mounted. The semiconductor chip 102 is sealed with a sealing resin 103, and a surface of the sealing resin 103 and side faces of the interposer substrate 101 are covered with a conductive film 104. The wireless apparatus 100A thus configured is called a semiconductor package or module with a shielding function.

The interposer substrate 101 is a substrate formed of an insulating base material on which a conductive portion formed of a metal material, such as copper, is formed. The interposer substrate 101 serves as a relay member that connects a component, such as the semiconductor chip 102 mounted on the interposer substrate 101, to a larger circuit board on which the wireless apparatus 100A is mounted. The conductive portion of the interposer substrate 101 is provided at least on the side of a component mounting face 101a on which a component such as the semiconductor chip 102 is mounted, and on the back face (a face on the side of the circuit board described above) opposite to the component mounting face 101a. The interposer substrate 101 may have a multi-layer structure including one or more layers of conductive portions between the above-described conductive portions. The conductive portions include, for example, a wiring pattern or ground of the interposer substrate 101. FIG. 5 exemplifies a conductive portion 120 that is a part of the ground provided adjacent to a side face of the interposer substrata 101.

The semiconductor chip 102 is formed by a semiconductor substrate made of, for example, silicon, silicon germanium, or gallium arsenide, in the interior or on the surface of which a metal pattern is formed with copper, aluminum, gold, or the like. The semiconductor chip 102 includes a transmitting/receiving circuit for transmitting and receiving signals. The semiconductor chip 102 is mounted on the component mounting face 101a of the interposer substrate 101, and is electrically connected to the wiring pattern or the ground of the interposer substrate 101 through a bonding wire, a bump, or the like.

Note that the semiconductor chip 102 may be formed of a dielectric substrate, magnetic substrate, metal, or a combination thereof. Alternatively, the semiconductor chip 102 may be formed as a chip-size package (CSP). FIG. 4 exemplifies the interposer substrate 101 on which one semiconductor chip 102 is mounted; however, the interposer substrate 101 may include a plurality of semiconductor chips 102 mounted thereon. In the latter case, the semiconductor chips 102 may be mounted by being stacked or by being aligned horizontally. In addition, FIG. 4 exemplifies the interposer substrate 101 on which the semiconductor chip 102 alone is mounted; however, the interposer substrate 101 may include components such as a chip capacitor, a resistance, an inductor, and an integrated circuit (IC) other than the semiconductor chip 102.

The sealing resin 103 is made of a thermosetting molding material containing, for example, an epoxy resin as the main component and silica filler or the like as an additive. The sealing resin 103 is arranged on the component mounting face 101a of the interposer substrate 101 to seal the semiconductor chip 102, thus protecting the semiconductor chip 102. The sealing resin 103 is an example of a nonconductive layer that seals the semiconductor chip 102. The nonconductive layer is not limited to resin, and may be of other nonconductive material or insulating material.

The conductive film 104 is made of, for example, a highly conductive metal material such as copper and silver, or a conductive paste that is a mixture of a metal material, such as silver, and an insulating material such as an epoxy resin. The conductive film 104 is formed to be a film that covers a surface (the outer face) of the sealing resin 103 and side faces of the interposer substrate 101. That is, the whole wireless apparatus 100A of the first embodiment is covered with the conductive film 104 except the back face of the interposer substrate 101. In the specification, a face of the conductive film 104 facing the component mounting face 101a of the interposer substrate 101 is referred to as a main face portion 104a of the conductive film 104 (refer to FIG. 2). In addition, a face of the conductive film 104 facing a side face of the interposes substrate 101 is referred to as a side face portion 104b of the conductive film 104 (refer to FIG. 3).

Although not illustrated, a stainless steel or titanium base film is formed between the sealing resin 103 and the conductive film 104 in order to prevent removal of the conductive film 104. In addition, a protective film is formed on the surface of the conductive film 104 in order to prevent oxidation and corrosion.

The conductive film 104 has a shielding function that prevents an electromagnetic wave of high frequency (from several tens of MHz to several GHz) from leaking outside the wireless apparatus 100A, the electromagnetic wave generated from the semiconductor chip 102 and acting as radiation noise. The shielding effect of the conductive film 104 depends on a sheet resistance value obtained by dividing the resistivity of the conductive film 104 by its thickness. The conductive film 104 preferably has a sheet resistance value of equal to or less than $0.5\Omega$ so as to prevent the leakage of radiation noise with excellent reproducibility.

In addition, the conductive film 104 is electrically connected to the conductive portion 120 of the interposer substrate 101. That is, because the conductive film 104 covers not only the surface of the sealing resin 103 but also the side faces of the interposer substrate 101, the conductive film 104 comes into contact with the conductive portion 120 serving as the ground at the side face of the interposer substrate 101, and thus electrically connects to the conductive portion 120. Connecting the conductive film 104 to the ground of the interposer substrate 101 with a low resistance can ensure a high shielding effect.

The wireless apparatus 100A of the first embodiment includes a slot antenna that is a slot aperture (a slit) provided from the conductive film 104 to the conductive portion 120 of the interposer substrate 101. Specifically, as illustrated in FIG. 1 to FIG. 3, a first slot aperture 111 is provided from the main face portion 104a to the side face portion 104b of the conductive film 104. Also, as illustrated in FIG. 5, a second slot aperture 112 is provided in the conductive portion 120 of the interposer substrate 101 such that the second slot aperture 112 connects to the first slot aperture 111.

The second slot aperture 112 is formed in the following manner: when a wiring pattern or ground is formed on the conductive portion 120 of the interposer substrate 101, a cut (slit) is formed in the conductive portion 120 provided adjacent to a side face of the interposer substrate 101, the cut being shaped by cutting from the side face of the interposer substrate 101. The first slot aperture 111 is formed in the following manner: the semiconductor chip 102 is mounted on the component mounting face 101a of the interposer substrate 101 having the conductive portion 120 in which the second slot aperture 112 is provided, the semiconductor chip 102 is sealed with the sealing resin 103 to form the conductive film 104, and then the main face portion 104a and the side face portion 104b of the conductive film 104 are cut with, for example, a laser processing apparatus or an end milling apparatus. At this time, the first slot aperture 111 is formed in the conductive film 104 by being aligned with the second slot aperture 112 such that the first slot aperture 111 connects to the second slot aperture 112 formed in the conductive portion 120 of the interposer substrate 101.

Connecting the first slot aperture 111 provided in the conductive film 104 and the second slot aperture 112 provided in the conductive portion 120 of the interposer substrate 101 allows the first slot aperture 111 and the second slot aperture 112 to compose an integrated continuous slot aperture. The integrated slot aperture including the first slot aperture 111 and the second slot aperture 112 has a length (slot length) of about half the wavelength of a desired frequency used for communication of the wireless apparatus 100A, the length being from an end portion e1 of the first slot aperture 111 at the side separated from the boundary between the first slot aperture 111 and the second slot aperture 112 as illustrated in FIG. 5, to an end portion e2 of the second slot aperture 112 at the side separated from the boundary between the second slot aperture 112 and the first slot aperture 111. The integrated slot aperture including the first slot aperture 111 and the second slot aperture 112, for example, serves as a slot antenna by being supplied with power through an antenna feed line (not illustrated) by electromagnetic field coupling or coplanar feeding, and is capable of efficiently radiating or receiving an electromagnetic wave of the desired frequency.

In the wireless apparatus 100A of the first embodiment, the slot antenna including the first slot aperture 111 and the second slot aperture 112 has a larger width at a portion where the first slot aperture 111 connects to the second slot aperture 112. That is, in the slot antenna of the wireless apparatus 100A of the first embodiment, a width W1 of a first portion including the boundary between the first slot aperture 111 and the second slot aperture 112 is larger than a width W2 or a second portion that is different from the first portion. In the example illustrated in FIG. 1 to FIG. 5, the width W1 of the first slot aperture 111 provided in the side face portion 104b of the conductive film 104 (an example of the first portion) is larger than the width W2 of the first slot aperture 111 provided in the main face portion 104a of the conductive film 104 and the width W2 of the second slot aperture 112 provided in the conductive portion 120 of the interposer substrate 101 (an example of the second portion).

As described above, the first slot aperture 111 and the second slot aperture 112 composing the slot antenna are formed in separate processes, and, if the apertures are misaligned in a production process, the apertures are discontinuous from each other, which deteriorates the characteristics of the slot antenna. Exemplary methods for preventing the deterioration of the antenna characteristics due to misalignment include enlarging the width of the apertures; however, a large aperture area in the conductive film 104 may cause deterioration of shielding performance.

To address such deterioration, in the wireless apparatus 100A of the first embodiment, the slot antenna including the first slot aperture 111 and the second slot aperture 112 has a larger width only at the first portion including the boundary between the first slot aperture 111 and the second slot aperture 112, and has a smaller width at the second portion that is different from the first portion. This shape provides robustness against misalignment in production so as to effectively prevent the discontinuation of the first slot aperture 111 and the second slot aperture 112 without needing to enlarge the aperture area of the conductive film 104 so much, thus ensuring excellent antenna characteristics while maintaining shielding performance.

Specifically, in the first embodiment, the first portion serving as a large-width aperture of the slot antenna is positioned at the side face portion 104b of the conductive film 104, the side face portion 104b being separated from the semiconductor chip 102 that is a source of radiation noise. Thus, an effect on the shielding performance of the conductive film 104 is minimized.

It is extremely advantageous to configure, as exemplified in FIG. 1 to FIG. 5, the entire first slot aperture 111 provided in the side face portion 104b of the conductive film 104 to have a large width to serve as the first portion of the slot antenna in that an antenna slot partly having a different width can be formed easily. For example, in a case of forming the first slot aperture 111 in the conductive film 104 by cutting with an end milling apparatus, a workpiece (the wireless apparatus 100A without the slot antenna being formed) is fixed on a stage, and the stage is moved in the y-axis direction in the drawings to form the first slot aperture 111 in the main face portion 104a of the conductive film 104 with a tip of the end mill. At a position where the tip of the end mill reaches the edge of an end of the main face portion 104a, the stage is moved in the z-axis direction in the drawings, and then is moved in the x-axis direction by a predetermined distance while the side face portion 104b of the conductive film 104 is cut with a side face of the end mill. This process can facilitate the formation of the first slot aperture 111, having a larger width than the width at the main face portion 104a, in the side face portion 104b of the conductive film 104. Alternatively, the first slot aperture 111 having a larger width than the width at the main face portion 104a may be formed in the side face portion 104b of the conductive film 104 by forming the first slot aperture 111 in the main face portion 104a of the conductive film 104 and then turning the workpiece 90 degrees to cut the side face portion 104b of the conductive film 104 with the tip of the end mill.

Figure 6A:
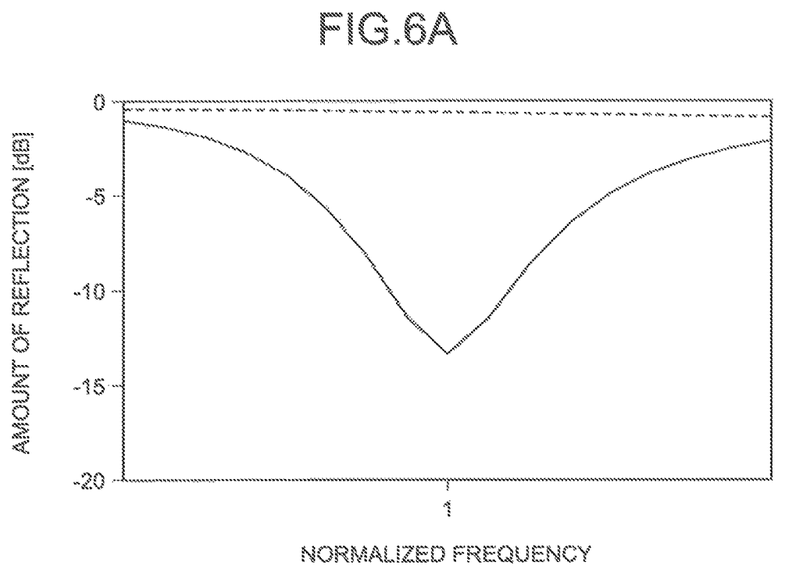
FIG. 6A and FIG. 6B are diagrams illustrating reflection characteristics of slot antennas.
Figure 6B:
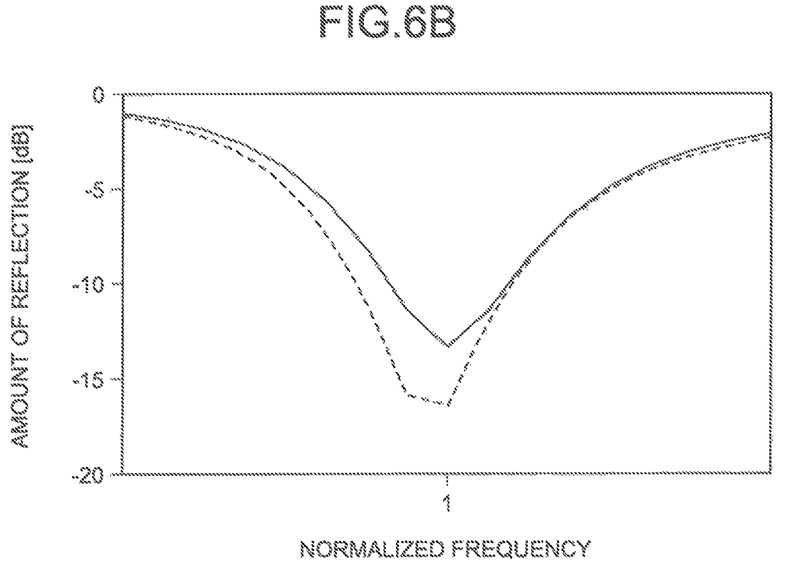
Figure 7A:
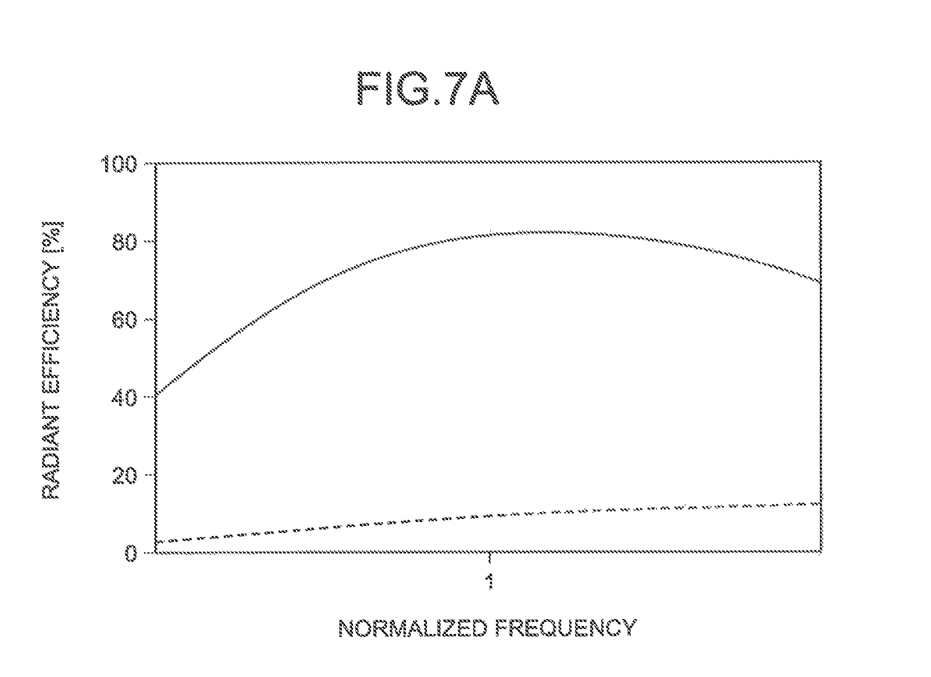
FIG. 7A and FIG. 7B are diagrams illustrating radiation characteristics of the slot antennas.
Figure 7B:
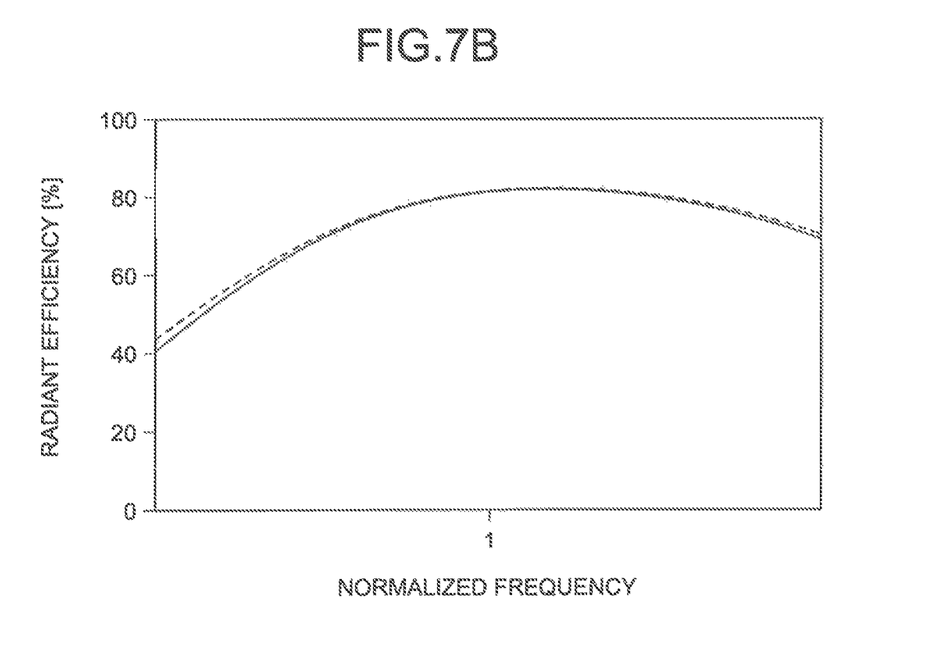

The following describes the antenna characteristics of the slot antenna of the first embodiment with reference to FIG. 6 and FIG. 7. FIG. 6A and FIG. 6B are diagrams illustrating reflection characteristics of the slot antenna of the first embodiment in comparison with those of a conventional art. FIG. 7A and FIG. 7B are diagrams illustrating radiation characteristics of the slot antenna of the first embodiment in comparison with those of a conventional art. FIG. 6A and FIG. 7A illustrate the characteristics of a slot antenna of a conventional art, and FIG. 6B and FIG. 7B illustrate the characteristics of the slot antenna of the first embodiment. The solid lines indicate the characteristics when no misalignment has occurred in production, and the broken lines indicate the characteristics when misalignment has occurred in production. The abscissas in the drawings indicate a normalized frequency when the desired frequency described above is 1. The conventional art exemplified here is assumed to be a slot antenna having a constant width (W2 illustrated in FIG. 2) in the entire length of the slot antenna. In addition, misalignment in production is assumed to be approximately the sane size as the W2 illustrated in FIG. 2.

As illustrated in FIG. 6A, when misalignment has occurred in production, the conventional art does not provide reflection characteristics needed for a slot antenna due to the discontinuation of the first slot aperture 111 and the second slot aperture 112. In contrast, in the first embodiment, the width W1 of the first portion including the boundary between the first slot aperture 111 and the second slot aperture 112 is larger than the width W2 of the second portion. Thus, as illustrated in FIG. 6B, even when misalignment has occurred in production, the first slot aperture 111 and the second slot aperture 112 are prevented from being discontinuous from each other, thereby providing excellent reflection characteristics.

As illustrated in FIG. 7A, when misalignment has occurred in production, the radiation efficiency of the slot antenna of the conventional art significantly decreases due to the discontinuation of the first slot aperture 111 and the second slot aperture 112. In contrast, in the first embodiment, the width W1 of the first portion including the boundary between the first slot aperture 111 and the second slot aperture 112 is larger then the width W2 of the second portion. Thus, as illustrated in FIG. 7B, even when misalignment has occurred in production, the first slot aperture 111 and the second slot aperture 112 are prevented from being discontinuous from each other, thereby providing approximately the same radiation efficiency as that obtained when no misalignment has occurred.

Figure 8:
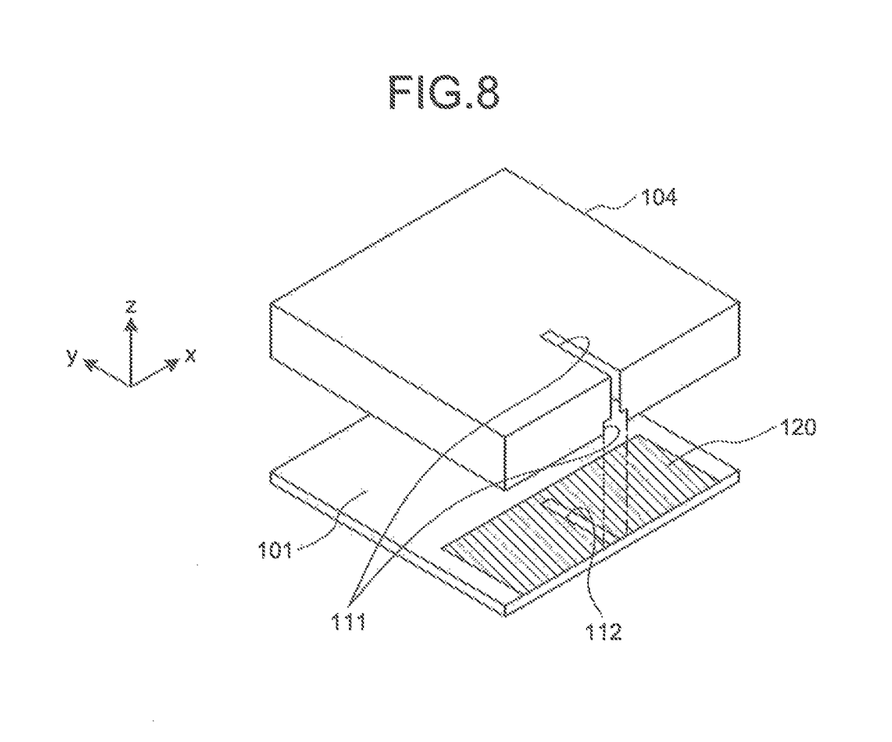
FIG. 8 is a diagram illustrating a modification of the first embodiment.

Note that the shape of the slot antenna of the wireless apparatus 100A illustrated in FIG. 1 to FIG. 5 is an example, and is not limiting. In the slot antenna of the first embodiment, at least the width W1 of a portion (the first portion) including the boundary between the first slot aperture 111 and the second slot aperture 112 may be larger than the width W2 of the rest of portions (the second portion). As exemplified in FIG. 8, only a part of the first slot aperture 111 provided in the side face portion 104b of the conductive film 104 may have a large width, the part including the boundary between the first slot aperture 111 and the second slot aperture 112. In this configuration, the large-width portion of the first slot aperture 111 provided at the side face portion 104b of the conductive film 104 corresponds to the first portion of the slot antenna.

Figure 9:
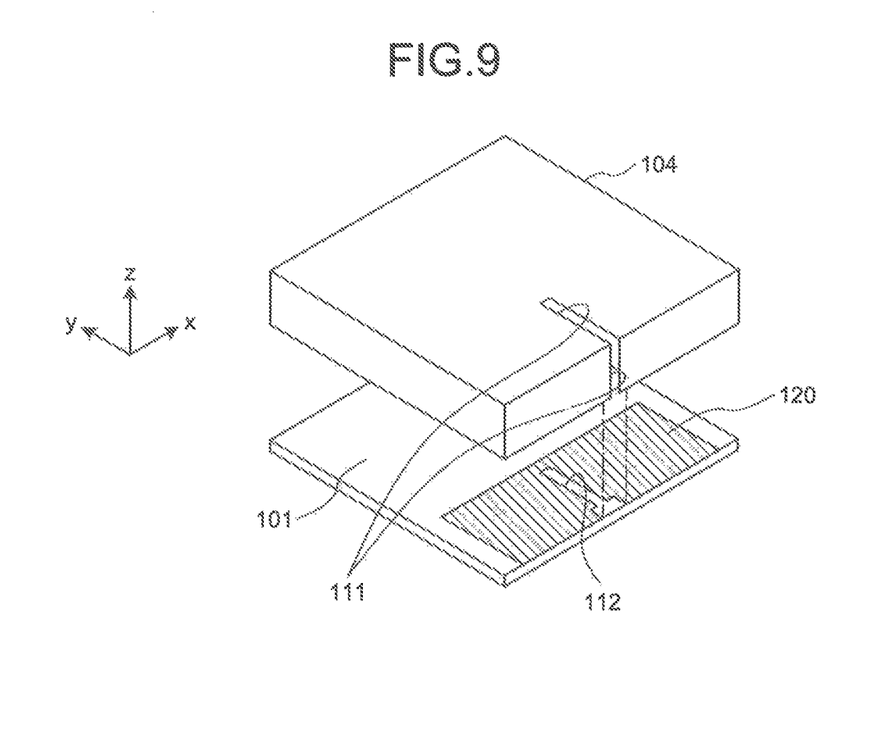
FIG. 9 is a diagram illustrating a modification of the first embodiment.

Alternatively, as exemplified in FIG. 9, only a part of the second slot aperture 112 provided in the conductive portion 120 of the interposer substrate 101 may have a large width, the part including the boundary between the second slot aperture 112 and the first slot aperture 111. In this configuration, the large-width portion of the second slot aperture 112 provided in the conductive portion 120 of the interposer substrate 101 corresponds to the first portion of the slot antenna.

The wireless apparatus 100A of the first embodiment described above is configured as, for example, a ball grid array (BGA) package or module to which terminals formed of solder balls are provided or the back face side of the interposer substrate 101. Alternatively, the wireless apparatus 100A way be configured as a land grid array (LGA) package or module in which lands provided on the back face side of the interposer substrate 101 serve as terminals. Note that the wireless apparatus 100A exemplified in FIG. 1 to FIG. 5 has a rectangular planar shape; however the outer shape of the wireless apparatus 100A is not limited thereto, and may be any of various shapes.

As described above, in the wireless apparatus 100A of the first embodiment, the first slot aperture 111 provided in the conductive film 104 connects to the second slot aperture 112 provided in the conductive portion 120 of the interposer substrate 101 to compose the integrated slot antenna. In the slot antenna, the width W1 of the first portion including the boundary between the first slot aperture 111 and the second slot aperture 112 is larger than the width W2 of the second portion that is different from the first portion. According to the first embodiment, this shape provides robustness against misalignment in production so as to effectively prevent the discontinuation of the first slot aperture 111 and the second slot aperture 112 without needing to enlarge the aperture area of the conductive film 104, thus ensuring excellent antenna characteristics while maintaining shielding performance.

Second Embodiment

Figure 10:
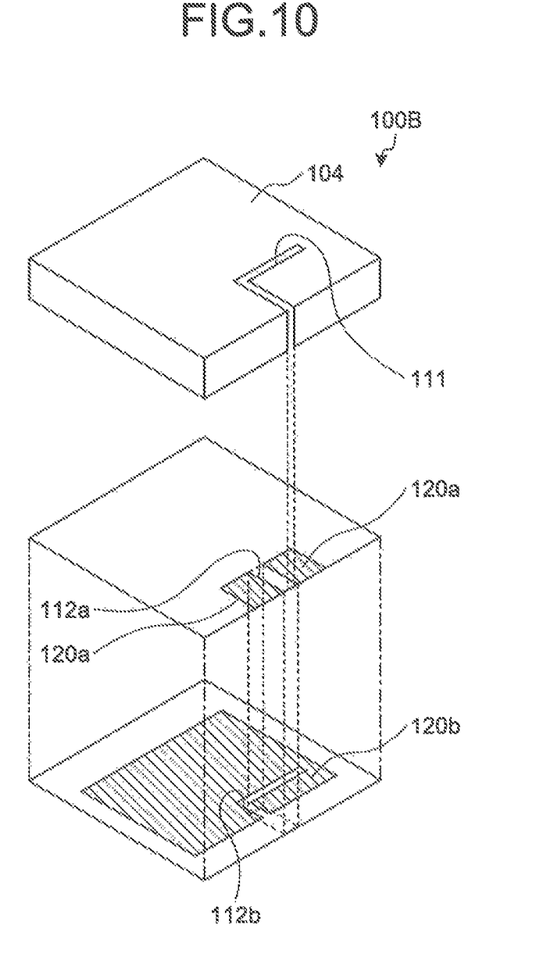
FIG. 10 is a diagram illustrating a second embodiment.
Figure 11:
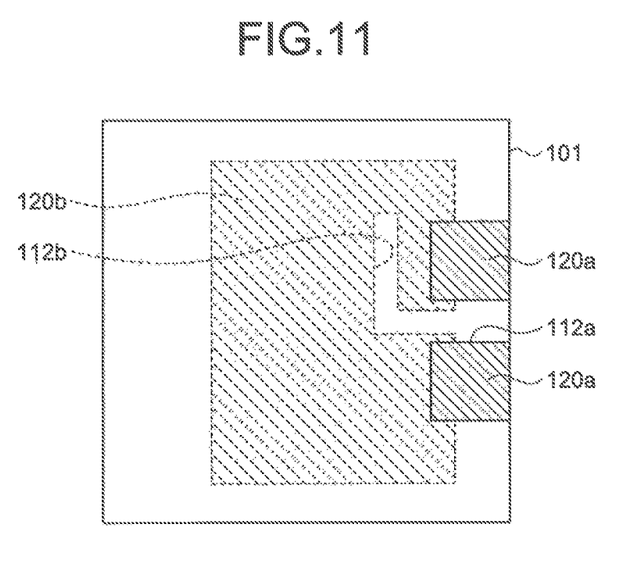
FIG. 11 is a plan view illustrating an interposer substrate of the second embodiment.

The following describes a wireless apparatus 100B according to a second embodiment with reference to FIG. 10 and FIG. 11. FIG. 10 is a diagram illustrating the second embodiment. FIG. 11 is a plan view illustrating an interposer substrate 101 of the second embodiment.

The wireless apparatus 100B of the second embodiment has the same basic structure as that of the wireless apparatus 100A of the first embodiment; however, the structure of a slot antenna is different from that of the wireless apparatus 100A of the first embodiment. That is, in the wireless apparatus 100B of the second embodiment, the second slot aperture 112 that composes the slot antenna with the first slot aperture 111 is provided across conductive portions 120 disposed on a plurality of respective layers in the interposer substrate 101.

FIG. 10 and FIG. 11 exemplify a conductive portion 120a and a conductive portion 120b that are provided on different two layers, respectively, in the interposer substrate 101. The second slot aperture 112 includes the second slot aperture 112a provided in one conductive portion 120a and the second slot aperture 112b provided in the other conductive portion 120b that are connected by an insulating base material present between the conductive portions 120a and 120b. That is, as illustrated in FIG. 11, the two second slot apertures 112a and 112b are provided in the conductive portions 120a and 120b, respectively, provided on the different layers in the interposer substrate 101 such that the second slot apertures 112a and 112b partly overlap each other when viewed in the thickness direction of the interposer substrate 101 in a plan view. FIG. 10 illustrates virtually separately the layers including the conductive portions 120a and 120b of the interposer substrate 101 in order to facilitate the recognition of the conductive portions 120a and 120b, and the second slot apertures 112a and 112b provided in the conductive portions 120a and 120b, respectively.

The second slot aperture 112a provided in the one conductive portion 120a of the interposer substrate 101 is positioned on a side face of the interposer substrate 101 at an end portion of a side opposite to the side of the second slot aperture 112b provided in the other conductive portion 120b, and connected to the first slot aperture 111 provided in the conductive film 104. The first slot aperture 111 provided in the conductive film 104, and the second slot aperture 112a provided in the conductive portion 120a and the second slot aperture 112b provided in the conductive portion 120b of the interposer substrate 101 compose an integrated slot antenna. Note that the two conductive portions 120a and 120b provided on the two layers, respectively, in the interposer substrate 101 may be conductive to each other by a conducting unit not illustrated.

The second slot aperture 112a provided in the one conductive portion 120a of the interposer substrate 101 has a width that is larger than the width of the second slot aperture 112b provided in the other conductive portion 120b. The first slot aperture 111 provided in the conductive film 104 has a width that is equivalent to the width of the second slot aperture 112b provided in the other conductive portion 120b of the interposer substrate 101. That is, in the second embodiment, the second slot aperture 112a provided in the conductive portion 120a of the interposes substrate 101 corresponds to the first portion of the slot antenna.

As described above, in the slot antenna of the second embodiment, a width of the first portion (the second slot aperture 112a provided in the one conductive portion 120a of the interposer substrate 101) including the boundary between the first slot aperture 111 and the second slot aperture 112 is larger than a width of a second portion (the first slot aperture 111 provided in the conductive film 104 and the second slot aperture 112b provided in the other conductive portion 120b of the interposer substrate 101) that is different from the first portion. Similarly to the first embodiment described above, this shape provides robustness against misalignment in production so as to effectively prevent the discontinuation of the first slot aperture 111 and the second slot aperture 132, thus ensuring excellent antenna characteristics while maintaining shielding performance.

In the second embodiment, the second slot aperture 112 is provided across the conductive portions 120 provided on the respective layers in the interposer substrate 101, and thus the degree of freedom in the shape of the slot antenna can be increased.

FIG. 10 and FIG. 11 exemplify the second slot aperture 112 (the second slot apertures 112a and 112b) provided across the conductive portions 120a and 120b on the respective two layers in the interposer substrate 101; however, the second slot aperture 112 may be provided across three or more conductive portions 120 provided on three or more respective layers in the interposer substrate 101.

Third Embodiment

Figure 12:
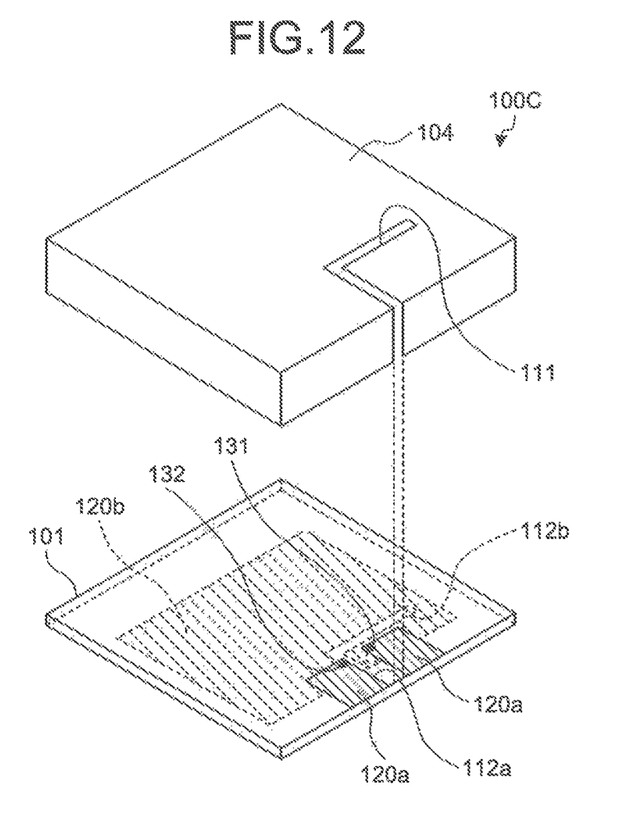
FIG. 12 is a diagram illustrating a third embodiment.
Figure 13:
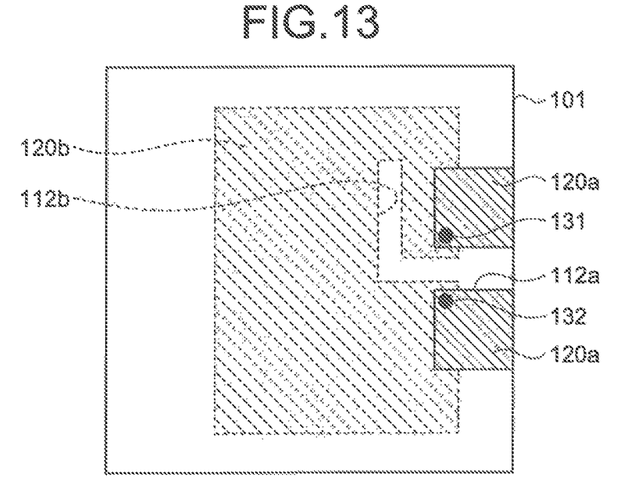
FIG. 13 is a plan view illustrating an interposer substrate of the third embodiment.

The following describes a wireless apparatus 100C according to a third embodiment with reference to FIG. 12 and FIG. 13. FIG. 12 is a diagram illustrating the third embodiment. FIG. 13 is a plan view illustrating an interposer substrate 101 of the third embodiment.

Similarly to the wireless apparatus 100B of the second embodiment, in the wireless apparatus 100C of the third embodiment, the second slot aperture 112 that composes a slot antenna is provided in the conductive portions 120 disposed on a plurality of respective layers in the interposer substrate 101. That is, as illustrated in FIG. 12 and FIG. 13, the conductive portion 120a and the conductive portion 120b are provided on different two layers, respectively, in the interposer substrate 101. The second slot aperture 112a is provided in the one conductive portion 120a, and the second slot aperture 112b is provided in the other conductive portion 120b. Specifically in the third embodiment, the one conductive portion 120a and the other conductive portion 120b of the interposer substrate 101 are conductive to each other through a pair of vias 131 and 132 provided at both sides, respectively, in the width direction of the second slot apertures 112a and 112b.

That is, as illustrated in FIG. 13, the two second slot apertures 112a and 112b are provided in the conductive portions 120a and 120b, respectively, provided on the different layers in the interposer substrate 101 such that the second slot apertures 112a and 112b partly overlap each other when viewed in the thickness direction of the interposer substrate 101 in a plan view. The pair of vias 131 and 132 are provided at both sides, respectively, of the positions where the second slot apertures 112a and 112b overlap each other. Through the pair of vias 131 and 132, the conductive portion 120a including the second slot aperture 112a and the conductive portion 120b including the second slot aperture 112b are conductive to each other.

In the third embodiment, as described above, the conductive portion 120a including the second slot aperture 112a and the conductive portion 120b including the second slot aperture 112b are conductive to each other through the pair of vias 131 and 132 provided at both sides, respectively, in the width direction of the second slot aperture 112a and 112b. Thus, even when the conductive portion 120a and the conductive portion 120b are spatially separated from each other, the two second slot apertures 112a and 112b provided in the conductive portion 120a and 120b, respectively, can be securely connected to each other to serve as a slot antenna.

According to at least one embodiment described above, excellent antenna characteristics can be ensured while shielding performance being maintained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A wireless apparatus comprising:
   an interposer substrate including a conductive portion;
   a semiconductor chip mounted on a component mounting face of the interposer substrate;
   a nonconductive layer provided on the component mounting face to seal the semiconductor chip; and
   a conductive film configured to cover a surface of the nonconductive layer and a side face of the interposer substrate, the conductive film being electrically connected to the conductive portion,
   the conductive film having a first slot aperture,
   the conductive portion having a second slot aperture connecting to the first slot aperture,
   the first slot aperture and the second slot aperture serving as an integrated slot antenna, and
   the slot antenna having a first portion and a second portion, the first portion including a boundary between the first slot aperture and the second slot aperture, the first portion having a width larger than a width of the second portion.

2. The apparatus according to claim 1, wherein the first portion is at least a part of the first slot aperture provided in a side face portion of the conductive film, the side face portion facing the side face of the interposer substrate.

3. The apparatus according to claim 1, wherein
   the interposer substrate includes a plurality of layers each having a conductive portion, and
   the second slot aperture is provided across the conductive portions.

4. The apparatus according to claim 3, wherein the conductive portions are conductive to one another.

5. The apparatus according to claim 4, wherein the conductive portions are conductive to one another through a pair of vias provided at both respective sides in a width of the second slot aperture.

* * * * *